(12) United States Patent  
Egitto et al.

(10) Patent No.: US 7,045,897 B2  
(45) Date of Patent: May 16, 2006

(54) ELECTRICAL ASSEMBLY WITH INTERNAL MEMORY CIRCUITIZED SUBSTRATE HAVING ELECTRONIC COMPONENTS POSITIONED THEREON, METHOD OF MAKING SAME, AND INFORMATION HANDLING SYSTEM UTILIZING SAME

(75) Inventors: Frank D. Egitto, Binghamton, NY (US); John M. Lauffer, Waverly, NY (US); How T. Lin, Vestal, NY (US); Voya R. Markovich, Endwell, NY (US); David L. Thomas, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 48 days.

(21) Appl. No.: 10/900,386

(22) Filed: Jul. 28, 2004

(65) Prior Publication Data

US 2006/0022310 A1     Feb. 2, 2006

(51) Int. Cl.
*H01L 23/48*     (2006.01)
(52) U.S. Cl. .................. 257/759; 438/82; 438/623; 438/3; 257/642
(58) Field of Classification Search ............... 257/759, 257/642; 438/82, 99, 623, 3
See application file for complete search history.

(56) References Cited

U.S. PATENT DOCUMENTS

| 4,956,694 A | 9/1990 | Eide |
| 5,016,085 A | 5/1991 | Hubbard et al. |
| 5,099,309 A | 3/1992 | Kryzaniwsky |
| 5,280,192 A | 1/1994 | Kryzaniwsky |
| 5,426,263 A | 6/1995 | Potter et al. |
| 5,831,833 A | 11/1998 | Shirakawa et al. |
| 6,084,306 A | 7/2000 | Yew et al. |
| 6,242,282 B1 | 6/2001 | Fillion et al. |
| 6,359,235 B1 | 3/2002 | Hayashi |
| 6,388,204 B1 | 5/2002 | Lauffer et al. |
| 6,479,093 B1 | 11/2002 | Lauffer et al. |
| 6,704,207 B1 | 3/2004 | Kopf |
| 6,734,478 B1 | 5/2004 | Johansson et al. |

*Primary Examiner*—Douglas W Owens
(74) *Attorney, Agent, or Firm*—Lawrence R. Fraley; Hinman, Howard & Kattell, LLP

(57) ABSTRACT

An electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof.

29 Claims, 6 Drawing Sheets

ELECTRICAL ASSEMBLY WITH INTERNAL MEMORY CIRCUITIZED SUBSTRATE HAVING ELECTRONIC COMPONENTS POSITIONED THEREON, METHOD OF MAKING SAME, AND INFORMATION HANDLING SYSTEM UTILIZING SAME

TECHNICAL FIELD

The present invention relates to circuitized substrates, and more particularly to composite circuitized structures such as printed circuit boards (PCBs) and the like adapted for having electronic components such as chip carriers and semiconductor chips positioned thereon. Such structures, when including these added components, will be referred to herein as electrical assemblies, but may have alternative names in the industry. The present invention also relates to methods for fabricating such structures, and to information handling systems (e.g., computers, servers, etc.) utilizing such assemblies.

CROSS REFERENCE TO CO-PENDING APPLICATION

In Ser. No. 10/900,385 entitled "CIRCUITIZED SUBSTRATE WITH INTERNAL ORGANIC MEMORY DEVICE, METHOD OF MAKING SAME, ELECTRICAL ASSEMBLY UTILIZING SAME, AND INFORMATION HANDLING SYSTEM UTILIZING SAME", filed concurrently herewith under there is defined a circuitized substrate which includes as part thereof an internal memory device capable of being electrically coupled to external electrical components (e.g., a logic semiconductor chip).

BACKGROUND OF THE INVENTION

A conventional procedure for forming known laminate circuitized substrates (e.g., PCB) structure includes forming layers of dielectric material and electrically conducting material to provide multiple layers of circuits and voltage planes. Circuits can be discrete wiring patterns known as signal planes. Voltage planes can be either ground plane or power planes, and are sometimes collectively referred to as power planes. In one technique of forming such structures, layers of dielectric material and conductive material are successively applied, e.g., the dielectric material is applied and then circuits or voltage planes are provided thereon and, typically, thru-holes (described in greater detail hereinbelow) are formed, typically by drilling or etching. This method relies on each successive step of adding additional structure and the circuitry layers are formed individually, e.g., in each step in forming the plane having circuit traces or formed power planes. This requires precision drilling to form the plated thru-holes (PTHs) all of which is time consuming, especially where there are a large number of drilled holes required to form PTHs.

Methods have been described that provide a relatively inexpensive photolithographic technique of forming a composite laminate structure (substrate assembly) from individual discrete laminate structures (substrates). For example, see U.S. Pat. No. 6,593,534 entitled "Printed Wiring Board Structure With Z-Axis Interconnections" and filed Mar. 19, 2001. See also U.S. Pat. No. 6,388,204 (Lauffer et al) and U.S. Pat. No. 6,479,093 (Lauffer et al), the teachings of which are incorporated herein by reference.

Multilayered structures such as double-sided PCBs often necessitate the provision of the aforementioned thru-holes between the various conductive layers or sides of the board. This is commonly achieved by providing metallized, conductive thru-holes in the board which communicate with the sides and layers requiring electrical interconnection. For some applications, it is desired that electrical connection be made with almost if not all of the conductive layers. In such a case, thru-holes are also typically provided through the entire thickness of the board. For these, as well as other applications, it is often desired to also provide electrical connection between the circuitry on one face of the board and one or more of the inner circuit layers. In those cases, "blind vias", passing only part way through the board are provided. In still another case, such multilayered boards often require internal "vias" which are located entirely within the board's structure and covered by external layering, including both dielectric and conductive. Such internal "vias" are typically formed within a sub-part structure of the final board and then combined with other layers during final lamination of the board. For purposes of this application, therefore, the term "thru-hole" is meant to include such conductive openings that pass entirely through the board (plated thru-holes or PTHs), "blind vias" which extend from an external surface of the board into a specified conductive layer of the board, as well as "internal vias" which is internally "captured" by the board's outer layers.

PCB and other substrate complexities have increased significantly over the past few years, due primarily to increased operational requirements for the products in which these substrates are utilized. For example, boards for mainframe computers may have as many as 36 layers of circuitry or more, with the complete stack having a thickness of about 0.250 inch (or 250 mils). These boards are typically designed with three or five mil wide signal lines and twelve mil diameter thru-holes. For increased densification in many of today's PCBs, the industry seeks to reduce signal lines to a width of two mils or less and thru-holes to a diameter of two mils or less. As will be defined herein in greater detail, a primary feature of the instant invention is the provision of a circuitized substrate possessing much greater operational capabilities than such substrates and electrical assemblies utilizing same known in the art. A specific feature of the invention is the inclusion of one or more organic memory devices within the substrate itself, thereby eliminating the need for externally mounted components of this type, thus saving more surface space for components such as hotter operating logic semiconductor chips and the like to even further increase the final product's operational capabilities. Yet another feature is the connection of this memory device to at least one of the external electrical components and the connection of this component to another located nearby on the substrate's external surface.

U.S. Pat. No. 6,704,207, entitled "Device and Method for Interstitial Components in a Printed Circuit Board", issued Mar. 9, 2004, describes a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor (manufactured by Rohm Co.), which has a thickness of about 0.014 inches.

U.S. Pat. No. 6,242,282, entitled "Circuit Chip Package and Fabrication Method", issued Jun. 5, 2001, describes a method for packaging a chip which includes the steps of providing an interconnect layer including insulative material having a first side and a second side, initial metallization patterned on second side metallized portions of the second side and not on second side non-metallized portions of the second side, a substrate via extending from the first side to one of the second side metallized portions, and a chip via extending from the first side to the second side non-metallized portion. The method also includes positioning a chip on the second side with a chip pad of the chip being aligned with the chip via, and patterning connection metallization on selected portions of the first side of the interconnect layer and in the via so as to extend to the second side metallized portion and to the chip pad. A "substrate" or other dielectric material is molded about the chip.

U.S. Pat. No. 6,084,306, entitled "Bridging Method of Interconnects for Integrated Circuit Packages", issued Jul. 4, 2000, describes an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

U.S. Pat. No. 5,831,833, entitled" Bare Chip Mounting Printed Circuit Board and a Method of Manufacturing Thereof by Photo-etching", issued Nov. 3, 1998, describes a method of manufacturing a "bare chip" multi-layer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board. In what appears to be the preferred embodiment, one of the insulating layers is made from a photosensitive resin, and the bare chip part mounting recessed portion is formed by photo-etching the insulating layer made from the photosensitive resin.

U.S. Pat. No. 5,426,263, entitled "Electronic Assembly Having a Double-sided Leadless Component", issued Jun. 20, 1995, describes an electronic assembly which has a double-sided leadless component and two printed circuit boards. The component has a plurality of electrical terminations or pads on both opposing major surfaces. Each of the printed circuit boards has a printed circuit pattern that has a plurality of pads that correspond to the electrical terminations on both sides of the double-sided leadless component. The electrical terminals on one side of the component are attached to the pads on the first board and the electrical terminals on the other side of the leadless component are attached to the pads on the second board. The printed circuit boards are joined together to form a multilayered circuit board so that the double-sided leadless component is buried or recessed inside. The component is attached to the pads of the printed circuit board using solder.

U.S. Pat. No. 5,280,192, entitled "Three-dimensional Memory Card Structure With Internal Direct Chip Attachment", issued Jan. 18, 1994, describes a card structure which includes an internal three dimensional array of implanted semiconductor chips. The card structure includes a power core and a plurality of chip cores. Each chip core is joined to the power core on opposite surfaces of the power core, and each chip core includes a compensator core having a two dimensional array of chip wells. Each chip well allows for a respective one of the semiconductor chips to be implanted therein. A compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

U.S. Pat. No. 5,099,309, entitled "Three-dimensional Memory Card Structure With Internal Direct Chip Attachment", issued Mar. 24, 1992, describes a memory card structure containing an embedded three dimensional array of semiconductor memory chips. The card structure includes at least one memory core and at least one power core which are joined together in an overlapping relationship. Each memory core comprises a copper-invar-copper (CIC) thermal conductor plane having a two dimensional array of chip well locations on each side of the plane. Polytetrafluoroethylene (PTFE) covers the major surfaces of the thermal conductor plane except at the bottoms of the chip wells. Memory chips are placed in the chip wells and are covered by insulating and wiring levels. Each power core comprises at least one CIC electrical conductor plane and PTFE covering the major surfaces of the electrical conductor plane. Provision is made for providing electrical connection pathways and cooling pathways along vertical as well as horizontal planes internal to the card structure.

U.S. Pat. No. 5,016,085, entitled "Hermetic package for integrated circuit chips, issued May 14, 1991, describes a hermetic package which has an interior recess for holding a semiconductor chip. The recess is square and set at 45 degrees with respect to the rectangular exterior of the package. The package uses ceramic layers which make up the package's conductive planes with the interior opening stepped to provide connection points. The lowest layer having a chip opening therein may be left out of the assembly to provide a shallower chip opening recess.

U.S. Pat. No. 4,956,694, entitled "Integrated circuit chip stacking", issued Sep. 11, 1990, describes a device for increasing the density of integrated circuit chips on a printed circuit board. A plurality of integrated circuits are packaged within chip carriers and stacked, on one top of the other, on a printed circuit board. Each of the input/output data terminals, power and ground terminals of the chips are connected in parallel. Each chip is individually accessed by selectively enabling the desired chip.

The above patents illustrate that various methods have been implemented for more closely "bonding" electronic components such as semiconductor chips and a substrate as one integral assembly, including the use of chip "recesses" with an appropriate cover or like material and, more specifically, as seen in two of these patents (U.S. Pat. Nos. 5,099,309 and 5,280,192), use of internal chip placement and coupling amongst the substrate's layered structure itself.

The present invention represents a significant advancement over the above structures and methods by providing a new and unique circuitized substrate in which one or more organic memory devices are integrally formed as part of the substrate's mutilayered structure and capable of effectively operating in conjunction with other components such as a logic semiconductor chip located externally of the substrate. The resulting electrical assembly, which also provides coupling of the electrical component connected to the internal memory device to other electrical components in a manner compatible with the manner used to connect the memory device and component. The formed substrate assures effective coupling of the integrally formed memory device(s) to conductive layers (e.g., signal lines, power or ground planes, etc.) of the substrate while also assuring optimum heat removal so as to maintain long component life. The invention is able to do this in such a manner that the method of forming the substrate can be carried out using many known PCB manufacturing processes with little modification thereto, thus assuring a final product without a corresponding relatively high cost.

The invention is also able to provide internal memory devices capable of being electrically coupled to such external components as a logic semiconductor chip with little or no signal "noise" and with significantly reduced impedance. In general, any structure that allows a signal to propagate from one point to another may be defined as a transmission line (in a PCB, such a line may be referred to as a "trace" if part of a substrate conductive layer, a plated "thru-hole" (PTH) if rendered conductive (e.g., plated with a metal such a copper), or even a conductive plane (e.g., power or ground) if in substantially solid, planar configuration. As a signal propagates along this line, both voltage and current are present. The ratio of these two parameters is defined as the characteristic impedance of the line which is a property determined solely by the material and geometry of the line. The characteristic impedance is proportional to the ratio of the inductance and capacitance of the line. In general, impedance is dependent upon frequency, but for lines that are essentially lossless, it can be considered constant. In signal lines, including PTHs for coupling "traces" with other "traces" on different conductive layers, ideally the signal arriving at the receiving end will be the same as that which entered the line at the driver end. However, if the transmission line changes characteristic impedance at any point along the way, signal behavior becomes more complicated. At the interface where such an impedance change occurs, partial reflections of the signal will be created. These reflected waves will travel back toward the source for possible reflection a second time. At each interface where an impedance change occurs, a reflected signal will thus be created. The reflections caused by these impedance mismatches have the ability to alter the original signal transmission, even possibly causing such problems as logic circuits to switch inadvertently. Furthermore, as signal "rise times" drop below a certain level (in highly dense PCB structures, 1 nanosecond (ns)), PCB thru-holes, including the relatively short internal "vias" mentioned above, may possibly create large enough reflections as to potentially cause significant signal transmission concerns. Consequently, as clock rates increase and signal rise times become short, as is currently being demanded for many of today's products, all portions of the interconnection path need to be well matched to the impedances of the other parts of the substrate and to the electronic components these lines interconnect. With particular attention to internal or other "vias" (as stated, all referred to as thru-holes herein), the capacitance created is by way of a stray electric field present between the via and the various power, ground or signal layers in the PCB. The inductance of the via is related to the magnetic field surrounding the portion of the via carrying the signal current. Typically, the inductance of the via is quite small relative to its capacitance. As such, most vias exhibit very low impedance and are a poor match to typical PCB traces. Reducing the via's capacitance or increasing the via's inductance will raise the via's impedance and create an improved match. This improvement will improve the capability to carry higher data rates from the internally positioned chip(s) through the via(s) to the substrate's external surfaces and thus to external components coupled to the substrate. The unique structure of the instant invention is able to provide effective coupling between an internal memory device and an external semiconductor chip or the like while substantially overcoming the aforementioned problems associated with other structures. Of further significance, the invention is able to do so with other means of coupling the external component to other components also mounted on the substrate, especially adjacent logic semiconductor chips or chip carriers having one or more chips therein.

It is believed that such an electrical assembly (substrate and components), method of making same, and an information handling system (defined below) which utilizes such an assembly or assemblies will constitute significant advancements in the art.

OBJECT AND SUMMARY OF THE INVENTION

It is, therefore, a primary object of the present invention to enhance the art of electrical assemblies such as PCBs having electrical components mounted thereon.

It is another object of the invention to provide an electrical assembly which includes a circuitized substrate having at least one (and possibly several) internally formed organic memory device as part of the multilayered circuitized substrate and electrically coupled to at least one designated electronic components (a prime example being a logic semiconductor chips) located externally of the substrate (e.g., one positioned directly or indirectly on the substrate).

It is a further object of the invention to provide a method of making such an electrical assembly which can be accomplished utilizing many known PCB manufacturing processes without a significant increase in the cost for making such a relatively complex final structure.

Yet another object of the invention is to provide an information handling system which effectively utilizes one or more of the electrical assemblies having the unique features taught herein.

According to one embodiment of the invention, there is provided an electrical assembly comprising a circuitized substrate including a first layer of organic dielectric material and a first electrically conductive circuit formed on the layer of organic dielectric material, part of this first layer of organic dielectric material and a corresponding part of the first electrically conductive circuit forming a first, base portion of an organic memory device, a thin layer of polymer material positioned on the corresponding part of the at least one electrically conductive circuit which forms the first, base portion of the organic memory device, and a second electrically conductive circuit formed on the thin layer of polymer material. The second electrically conductive circuit and corresponding part of the first electrically conductive circuit each comprise a plurality of narrow circuit lines which cross each other at predetermined locations to define points of contact at such locations, said thin layer of organic polymer material and second electrically conductive circuit forming a second portion of the organic memory device. A second layer of organic dielectric material is positioned over the organic memory device, a first electrical component is positioned on the circuitized substrate and electrically coupled to the organic memory device through this second layer of organic dielectric material, and a second electrical component positioned on the circuitized substrate and electrically coupled to said first electrical component.

According to another embodiment of the invention, there is provided a method of making a an electrical assembly comprising providing a circuitized substrate including a first layer of organic dielectric material and a first electrically conductive circuit on said first layer of organic dielectric material. Part of the first layer of organic dielectric material and a corresponding part of the first electrically conductive circuit form a first, base portion of an organic memory device. The method also comprises forming a thin layer of polymer material on the corresponding part of the at least one electrically conductive circuit which forms the first, base portion of said organic memory device and forming a second electrically conductive circuit on the thin layer of polymer material, the second electrically conductive circuit and corresponding part of the first electrically conductive circuit each comprising a plurality of narrow circuit lines which cross each other at predetermined locations to define points of contact. The thin layer of organic polymer material and second electrically conductive circuit form a second portion of the organic memory device. The method further comprises forming a second layer of organic dielectric material over the organic memory device, positioning a first electrical component on the circuitized substrate and electrically coupling the organic memory device through the second layer of organic dielectric material to the first electrical component, and positioning a second electrical component on the circuitized substrate and electrically coupling this second electrical component to the first electrical component.

According to yet another embodiment of the invention, there is provided an information handling system comprising a housing, a circuitized substrate positioned substantially within the housing and including a first layer of organic dielectric material and a first electrically conductive circuit formed on the first layer of organic dielectric material, part of the first layer of organic dielectric material and a corresponding part of the first electrically conductive circuit forming a first, base portion of an organic memory device. The system further includes a thin layer of polymer material positioned on the corresponding part of the at least one electrically conductive circuit which forms the first, base portion of the organic memory device, and a second electrically conductive circuit formed on the thin layer of polymer material, the second electrically conductive circuit and corresponding part of the first electrically conductive circuit each comprising a plurality of narrow circuit lines which cross each other at predetermined locations to define points of contact, the thin layer of organic polymer material and second electrically conductive circuit forming a second portion of the organic memory device. The system further includes a second layer of organic dielectric material positioned over the organic memory device, a first electrical component positioned on the circuitized substrate and electrically coupled to the organic memory device through the second layer of organic dielectric material, and a second electrical component also positioned on the circuitized substrate and electrically coupled to the first electrical component.

BRIEF DESCRIPTION OF THE DRAWINGS

FIGS. 1–3A are partial perspective views showing three steps in forming a circuitized substrate for use in an electrical assembly according to one embodiment of the invention, the view in FIG. 3A showing the formation of a basic organic memory device in its simplest form in accordance with one embodiment of this invention;

BEST MODE FOR CARRYING OUT THE INVENTION

Figure 1:
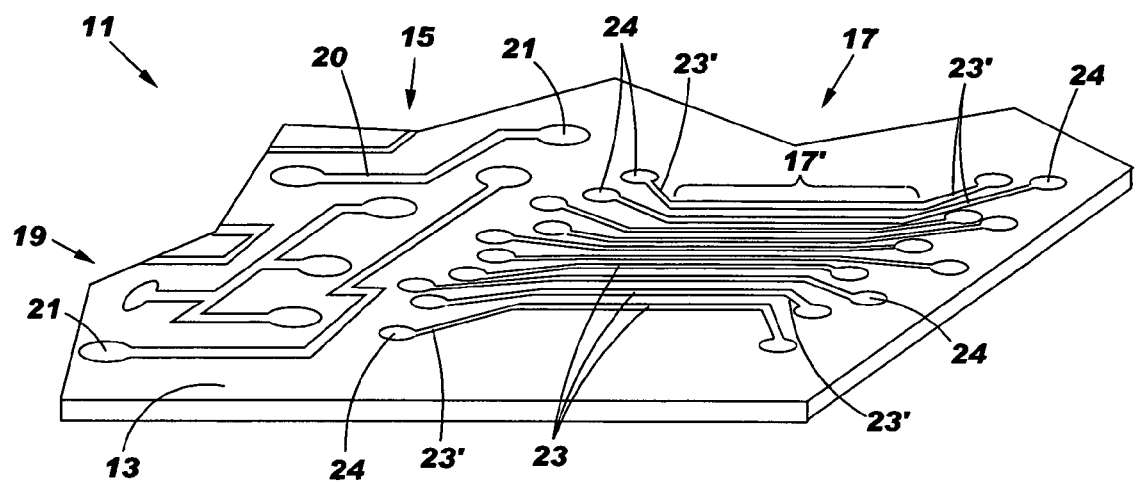

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

The following terms will be used herein and are understood to have the meanings associated therewith.

By the term "circuitized substrate" is meant to include substrates having at least one dielectric layer and one conductive layer. In many cases, such substrates will include several dielectric and conductive layers. Examples include printed circuit boards (PCBs) or like structures made of dielectric materials such as fiberglass-reinforced epoxy resins, polytetrafluoroethylene (Teflon), polyimides, polyamides, cyanate resins, photoimageable materials, and other like materials wherein the conductive layer is a metal layer (e.g., power or signal plane) comprised of suitable metallurgical materials such as copper but may include or comprise additional metals (e.g., nickel, aluminum, etc.) or alloys thereof. A preferred dielectric material is polyimide. If the dielectric is a photoimageable material, it is photoimaged or photopatterned, and developed to reveal the desired circuit pattern, including the desired opening(s) as defined herein, if required. The dielectric material may be curtain-coated or screen- applied, or it may be supplied as dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition. The dielectric layers taught herein may be typically about 2 mils to about 4 mils thick. In addition to the aforedefined at least one dielectric layer and corresponding electrically conductive layer, the term "circuitized substrate" as used herein to define the instant invention is meant a structure including at least the basic elements (two conductive layers aligned relative to one another and crossing in a defined "bit" pattern) of an organic memory device.

By the term "circuitized substrate assembly" as used herein to define the present invention is meant to include at least one such circuitized substrate in a bonded configuration with one or more substrates including at least one dielectric layer and a corresponding conductive circuit layer thereon, one example of bonding such substrates being conventional lamination procedures known in the art and another being the use of conductive paste to couple two formed substrates along a common pattern of conductors (e.g., thru-holes). These additional substrates may or may not include an internal organic memory device as part thereof.

By the term "electronic component" as used herein is meant components such as semiconductor chips (e.g., logic chips), resistors, capacitors and the like, which are adapted for being positioned on the external conductive surfaces of such substrates as PCBs and possibly electrically coupled to other components, as well as to each other, using, for example the PCB's internal and/or external circuitry. This term as used herein to define the present invention is also meant to include chip carriers which include a substrate having at least one chip thereon and are often in the form of a "package" having other working elements such as a heat sink for providing heat sinking of the external chip to which it is thermally coupled.

By the term "optoelectronic" as used herein is meant an optical means such as a fiber or other medium (e.g., a transparent polymer) capable of passing light signals therethrough which can be received and converted to electrical signals using one or more electrical components such as those defined herein.

By the term "organic memory device" as used herein when defining the invention is meant an electrically functioning structure capable of amplification, oscillation and/or switching actions, having an organic material as at least one layer of its dielectric and appropriate metallurgical or other electrically conductive materials as its electrically conductive circuitry. Such a device will include at least two dielectric layers and a corresponding number of conductive circuits and will be an integral part of a "circuitized substrate."

By the term "electrically conductive paste" as used herein is meant to include a bondable (e.g., capable of lamination) conductive material capable of being dispensed within openings of the type taught herein. Typical examples of bondable electrically conductive material are conductive pastes such as silver filled epoxy paste obtained from E.I. duPont deNemours and Company under the trade designation CB-100, Ablebond 8175 from the Ablestick Company and filled polymeric systems, thermoset or thermoplastic type, containing transient liquid conductive particles or other metal particles such as gold, tin, palladium, copper, alloys, and combinations thereof. One particular example is coated copper paste. Metal coated polymeric particles disposed in a polymeric matrix can also be used.

By the term "sticker sheet" as used herein is meant to include dielectric materials such as conventional pre-preg materials used in conventional, multilayered PCB construction, e.g., usually by lamination. Other examples include the products Pyrolux and liquid crystal polymer (LCP) or other freestanding films. These dielectric sticker sheets may be adhesively applied to one or both of the two circuitized substrates to assist in bonding these two components. These sheets may also be patterned, e.g., by laser or photoimaging, if desired. Significantly, such sheets can also include a conductive plane (including signal, ground and/or power) therein to further increase the circuit density of the finished, bonded product taught herein. Such sticker sheets may be typically 5 to 8 mils (thousandths) thick.

By the term "electrical assembly" is meant at least one circuitized substrate as defined herein in combination with at least one electronic component electrically coupled thereto and forming part of the assembly. Examples of known such assemblies include PCBs and chip carriers which include a semiconductor chip as the electronic component, the chip usually positioned on the carrier's substrate and coupled to wiring (e.g., pads) on the substrate's outer surface or to internal conductors using one or more thru-holes. If a PCB, this assembly is capable of having a singular chip mounted thereon or a more complex structure such as a chip-containing chip carrier product.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB can be referred to as a "motherboard" while various other boards (or cards) may be mounted thereon using suitable electrical connectors.

FIG. 1 illustrates one example of a first step of producing a circuitized substrate 11 for use as part of an electrical assembly (below) according to one embodiment of the invention. Substrate 11 is shown to include at least one layer 13 of organic dielectric material having thereon at least two different portions 15 and 17 of an electrically conductive circuit 19. In a preferred embodiment, layer 13 is comprised of polyimide but may also be of one of the other dielectric materials described above. In one embodiment, layer 13 may possess a thickness of only from about 0.0005 inch (") to about 0.010" and have width and length dimensions typical of those presently used in the printed circuit board (PCB) industry. In such an example, layer 13 may have a width of about 18" and a length of about 24". Such dimensions are not limitive of the invention, however, as the circuitized substrate produced in accordance with the teachings herein may be of a variety of different width and length dimensions, depending on final product requirements.

Conductive circuit 19 is preferably formed using conventional photolithographic processing known in the PCB industry and further description is not believed necessary. Such circuitry is preferably copper but may be of other conductive materials, including aluminum, alloys of copper or aluminum, conducting polymers, or combinations thereof. Portion 15 of conductive circuit 19 is formed having conventional lines 20 (traces) and other circuit elements (i.e., pads 21) coupled to such lines, depending on the predetermined circuit design. Such lines as shown in FIG. 1 may thus have a width of from about 0.001" to about 0.008" and the resulting pads 21 may be of substantially round configuration with a diameter of from about 0.005" to about 0.030". Other elements and/or configurations may form part of the portion 15 of circuit 19, as is known in PCB manufacturing.

Portion 17 of circuit 19 is of a highly dense pattern, for reasons explained herein-below, and represents a significant aspect of this invention. This pattern is preferably comprised of several parallel linear lines 23 which form a substantially rectangular (preferably square) pattern 17' as shown in FIG. 1. That is, only the linear lines form the square pattern and include at the ends thereof a plurality of extension lines 23' which terminate in corresponding pads 24. In a preferred embodiment, each line 23 possesses a width of only from about five to about fifty microns and a length of only from about 0.1" to about 2.5", and the resulting extending lines 23' and associated pads 24 possess a width also of from about five to about fifty microns and diameters from about 0.005" to about 0.030", respectively. The projecting lines 23' and pads 24 may be of similar dimensions to those shown in the first portion 15 of circuit 19, but it is essential that the parallel singular trace lines (traces) 23 possess the extremely narrow width, highly dense pattern described. It is understood that lines 23 and the corresponding projecting lines and pads form the first conductive layer of a basic organic memory device in accordance with one embodiment of the teachings herein. As seen, this memory device circuitry is formed simultaneously with that of the conventional circuitry of a PCB.

Figure 2:
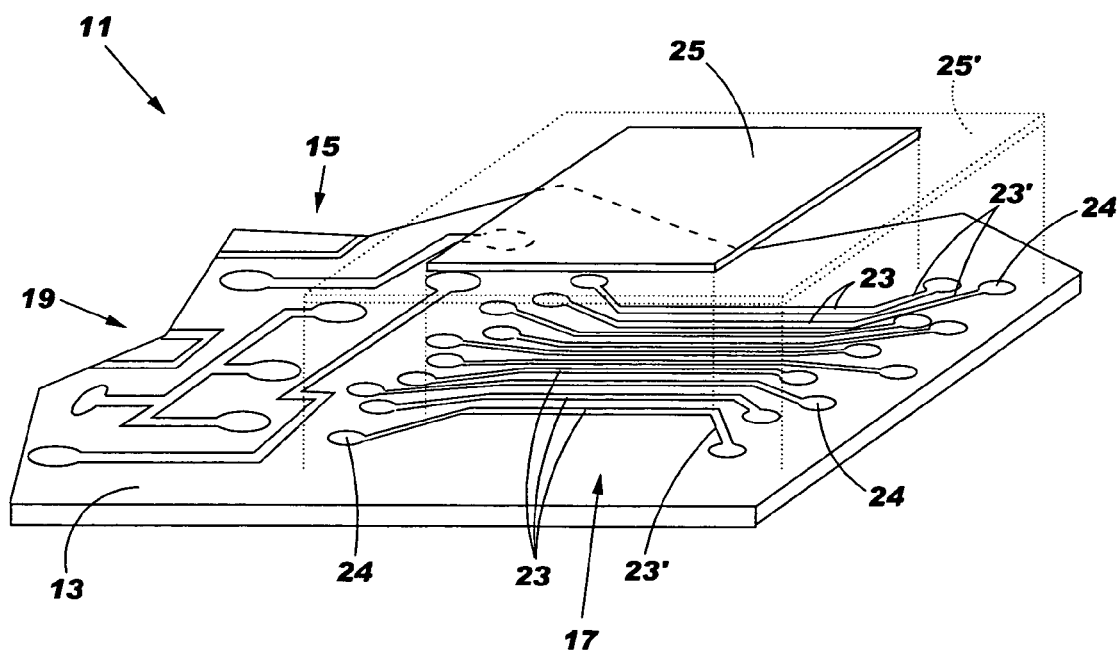

In FIG. 2, there is illustrated one example of a second step of forming the circuitized substrate including at least one organic memory device according to one embodiment of the invention. A second dielectric layer 25, if in solid sheet form, is aligned over the linear pattern 17' of conductive lines 23 and deposited thereon. Such deposition is preferably done using conventional PCB equipment, depending on the chosen process (or combination of processes) to be utilized to accomplish the dielectric layer positioning. If layer 25 is to be provided in the illustrated solid sheet form, a preferred method of securing it over conductive layer portion 17 is to use conventional PCB lamination. If layer 25 is to be provided initially in liquid form (not shown), acceptable processes for accomplishing its application include spin coating, roller coating, draw coating, slot coating and curtain coating. Layer 25 may also be positioned using conventional printing processing. Other organic film deposition techniques such as electrostatic deposition coating may also be employed. The second organic dielectric layer 25 is preferably a polymer, and more preferably a ferroelectric thin film material. Preferred examples of such thin film materials usable in the instant invention include polyvinylidene and copolymers thereof such as polyvinylidene fluoride-trifluoroethylene (PVDF-TFE), and nylons (preferably odd-numbered) and copolymers thereof. Other materials are also acceptable provided these assure the needed properties of those identified. According to one embodiment, each layer 25 possesses a thickness of only about 0.5 to three microns with sided dimensions of 0.2" to about 3". As stated, the pattern 17' on which the second layer 25 is positioned is preferably square, and thus so is the thin layer 25.

Figure 3A:
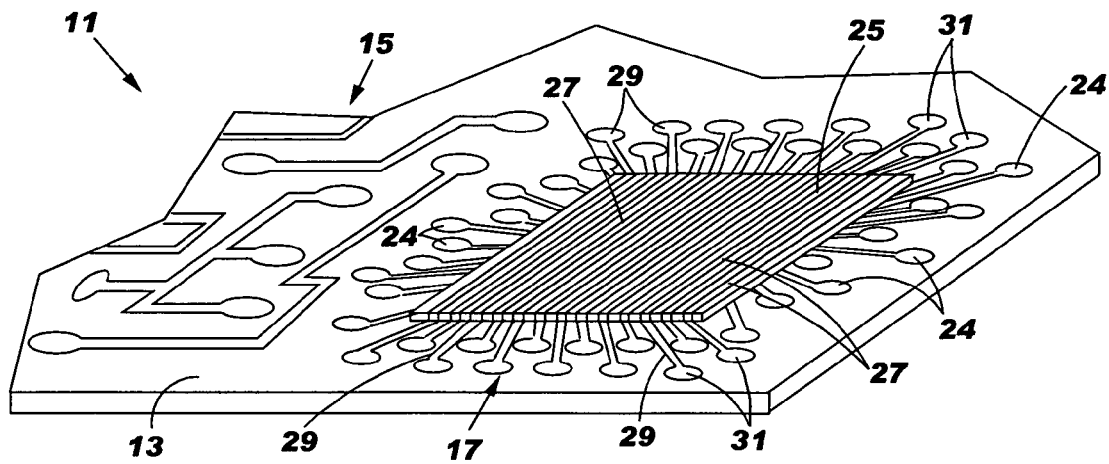

FIG. 3A illustrates a third step of forming an organic memory device (in its simplest form) as part of a circuitized substrate according to one embodiment of the invention. In this step, a second substantially square pattern of linear electrically conductive lines (traces) are formed atop the surface of ferroelectric thin film layer 25. These lines, each represented by the numeral 27, are preferably of similar width (and length) to lines 23 in FIG. 2 but run in a pattern substantially perpendicular thereto. Clearly, these lines are also electrically conductive and also preferably of a material similar to lines 23. Of significance, it is noted in FIG. 3A that the formation of lines 27, preferably accomplished using photolithographic processing, results in the extension of lines down the sides of the ferroelectric thin film layer 25 at opposing ends thereof and the resulting formation of extensions 29 on the upper surface of dielectric layer 13. Such extension lines 29 each preferably terminate in a pad 31 such that an opposing array of such pads are formed and correspond to the similarly opposing array of pads 24 for the first layer of lines 23. Again, the ultimate use for pads 24 and 31 will be described below. These pads and the extension lines thereto possess similar dimensions as the extensions 23' and terminal pads 24 for the first layer. It is thus seen in FIG. 3A that two separate parallel patterns of linear traces are formed and result in corresponding pads at the end thereof in such an orientation that both conductive patterns are completely electrically isolated from each other by the spacing on the upper surface of layer 13 and, most importantly, the thickness of the ferroelectric thin film layer 25.

Figure 4:
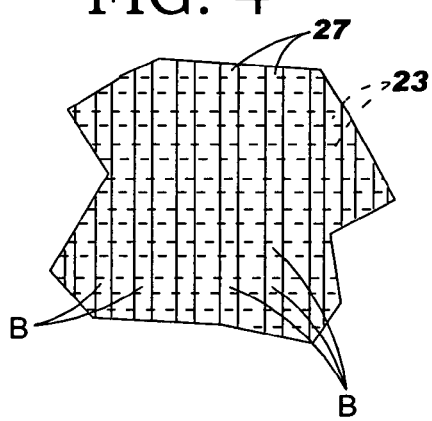
FIG. 4 is an enlarged partial plan view showing the crossing pattern of linear circuit lines of an organic memory device for the substrates shown in both FIGS. 3A and 3B.

In FIG. 4, there is shown an enlarged, partial plan view illustrating the intersection of parallel lines 23 (hidden) and 27. Each point B forms one of several "bits" for the resulting memory device. When an electrical field is established across a corresponding pair of intersecting lines 23 and 27, as caused by the passage of current through these intersecting lines, at the corresponding predetermined bit B, the memory cell is switched between two polarization states of the interim ferroelectric thin film material. As stated, the formation of two parallel layers represents the simplest form of a memory device and that it is preferred to form one with substantially more layers of conductors and ferroelectric thin film materials to thus produce a memory device with much greater capability than that shown. By way of example, such a memory device produced in accordance with the teachings herein may include from the defined two to about ten conductive layers with a corresponding number of interim ferroelectric thin film layers. Should additional layers be desired and the conductors extend down the sides of the ferroelectric thin film layers, it is understood that narrower patterns for the individual lines would be essential. The pattern illustrated in the drawings is, therefore, not necessarily to scale but may be of different widths than those shown, depending on such number of conductive layers desired for the final product. The resulting structure, having as many as ten conductive layers in the cross-patterned orientations shown, will thus include several thousands of "bits" for activation when the structure is in operation.

Figure 3B:
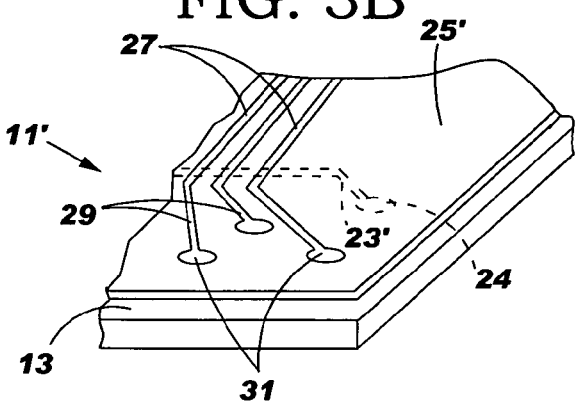
FIG. 3B is a partial perspective view similar to part of FIG. 3A, representing an alternative embodiment of how the second layer of circuitry on the invention's organic memory device may be formed in comparison to the method shown in solid in FIG.3A.

In FIG. 3B, there is shown an alternative version of forming the second (and additional) conductive layers of an organic memory device of the invention. In FIG. 3B, the ferroelectric thin film layer 25' for this circuitized substrate (now referenced by numeral 11') extends beyond the boundaries of the substantially square pattern 17' of first layer linear traces 23 to approximately the same distance from the pattern as the underlying first pads 24 and connecting lines 23' (only one such line and pad are shown (hidden) in FIG. 3B for illustration purposes). This enables the formation of coplanar extension lines 29 and pads 31 for each of the individual lines 27 on the upper surface of the extended, larger ferroelectric thin film layer 25'. It is not necessary, therefore, that these lines extend down the side of a smaller ferroelectric thin film layer as in the embodiment of FIG. 3A. This alternative ferroelectric thin film sheet 25' is shown in phantom in FIG. 2 and thus illustrative of its approximate size relative to the underlying first pattern of conductors 23. Adhesion of the second, alternative layer 25' is preferably accomplished similarly to that for layer 25 and the simultaneous formation of linear traces 27 and extension lines 29 and pads 31 in the illustrative coplanar pattern is preferably accomplished using photolithographic processing as was the second pattern in FIG. 3A.

Figure 5:
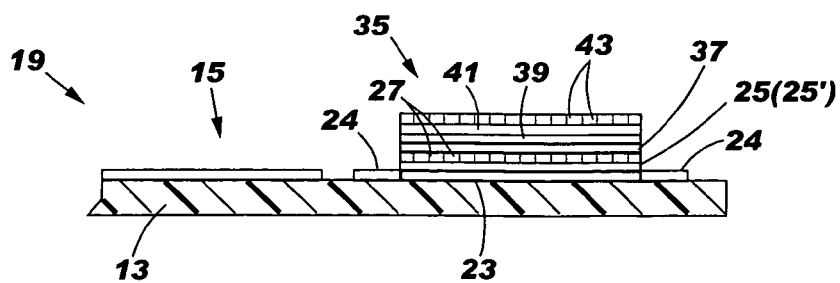
FIG. 5 is an enlarged, partial side elevational view, in section, of the circuitized substrates of both FIGS. 3A and 3B.

FIG. 5 represents a partial, side elevational view showing only the first dielectric layer 13 and the first portion 15 of circuit 19 and the first and second conductive layers of the memory device in its simplest form as shown and described hereinabove, with the addition of another layer of conductors and interim ferroelectric thin film layers. The device, represented by the numeral 35, thus includes the defined first layer of circuitry comprised of parallel lines 23 (only one shown) and projecting pads 24, all on the planar upper surface of layer 13. The ferroelectric thin film layer 25 (or 25' if the FIG. 3B embodiment is chosen) is also shown and the subsequent individual linear lines 27 (facing the viewer in FIG. 5). Atop this second layer is yet a second ferroelectric thin film layer 37 similar to one of the layers 25 and 25' and atop this another circuit pattern of linear conductors 39 (only one shown). Atop this second linear array of traces 39 is a third ferroelectric thin film layer 41 and atop this layer yet another conductive layer of individual parallel traces 43 (facing the viewer in FIG. 5). The embodiment of FIG. 5 is thus meant to better illustrate the multi-stacked embodiment for a memory device which can be formed in accordance with the unique teachings herein wherein more than simply two conductive layers are chosen.

Figure 6:
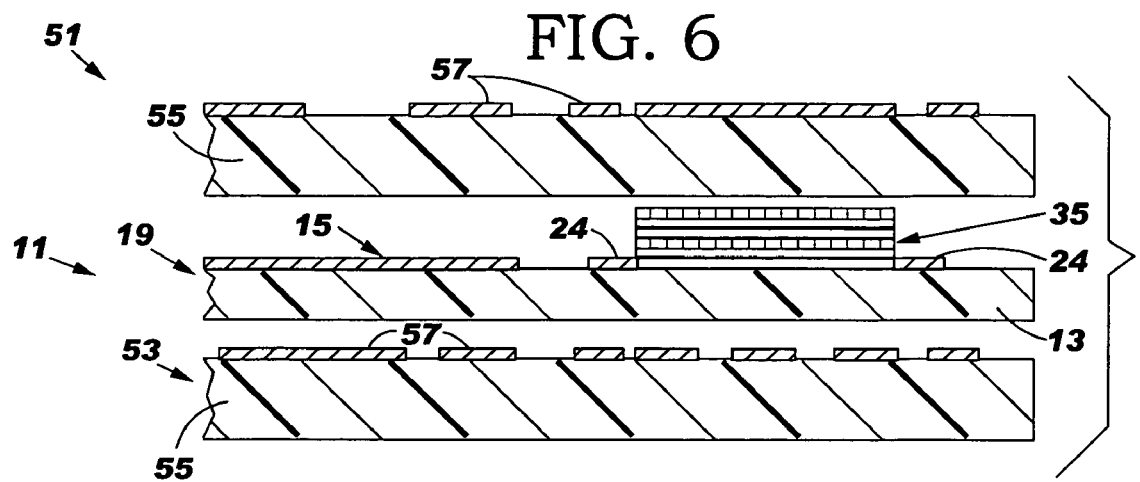
FIGS. 6–8 are enlarged, partial side elevational views showing the formation of a multilayered circuitized substrate which includes the substrate of either FIG. 3A or 3B as part thereof, FIG. 6 being an exploded view to better illustrate the initial layers of the resulting structure in FIG. 8.
Figure 7:
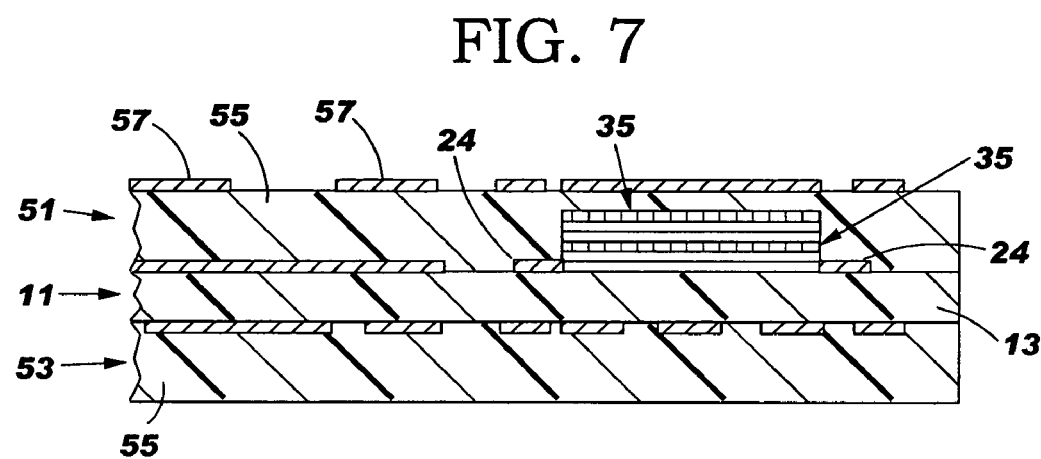
Figure 8:
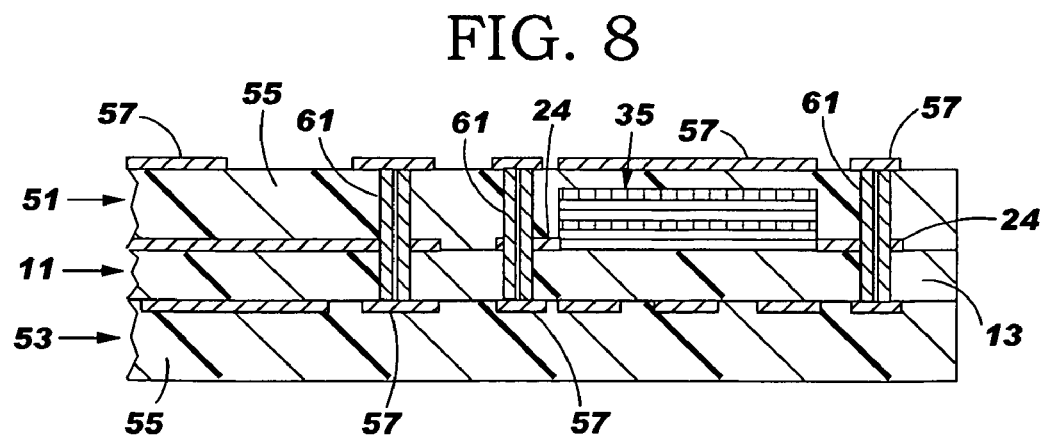

FIGS. 6–8 illustrate the steps of forming a multilayered circuitized substrate according to one embodiment of the invention. The resulting substrate will include at least one of the circuitized substrates 11 defined above including at least one organic memory device 35 as part thereof. The memory device in FIGS. 6–8 (and 9 and 10) is shown only schematically and not to the detail in FIG. 5 or preceding FIGS. The circuitized substrate 11 is aligned with additional substrates 51 and 53 on opposite sides thereof. Each substrate 51 and 53, as defined above, includes at least one dielectric layer 55 and a conductive circuit layer including, e.g., circuit elements 57 (lines and/or pads) thereon. The dielectric layers 55 may be of conventional PCB materials as described above, including, significantly, a material dissimilar to that of substrate 11. For example, it is within the scope of the invention to utilize the aforementioned polyimide dielectric for substrate 11 and mate this substrate with opposing substrates having the conventional "FR4" (fiberglass-reinforced hardened epoxy resin) dielectric material. Additionally, these additional substrates may include circuit elements of different metallurgy and/or thicknesses and widths. Preferably, the circuitry which forms elements 57 is similar to that which forms the first part 15 of circuit 19 for substrate 11. Still further, the substrates 51 and 53, albeit shown without an organic memory device, may include at least one such device as part thereof, and still be aligned and bonded (e.g., laminated) to the interim substrate 11 already having such a device as an integral part thereof. Such a resulting "stacked" orientation of devices in a structure is shown in the schematic view shown in FIG. 9. As mentioned, substrates 51 and 53, including the required at least one dielectric and conductive layers, do not need to include a memory device.

FIG. 7 shows the three substrates 11, 51 and 53 bonded together, preferably utilizing conventional lamination processing in which predetermined temperatures and pressures are utilized. According to the teachings herein, it is not necessary to alter these pressures and temperatures over conventional such parameters to form the multilayered substrate taught herein. The result of such lamination is the secure bonding of all three substrates as shown. Prior to such formation, it may be desirable to provide an interim "sticker sheet" dielectric layer as defined above between each spaced pair of substrates. It is also within the scope of this invention to bond conductors on one substrate (e.g., assuming such conductors (not shown but similar to those on the upper surface) were formed on the underside of the top substrate 51). These underside conductors could be coupled using a conductive paste of the type defined above to one or more of the pads 21 shown in FIGS. 1–3, for example.

FIG. 8 illustrates the next step of forming the multilayered circuit structure, this being the provision of thru-holes 61 within the structure. Thru-holes 61 are formed using conventional PCB technology in which individual holes are drilled (e.g., using mechanical drills or lasers) within the substrate after which a conductive thin layer (e.g., copper) is plated onto the surfaces of the openings. The thru-holes 61 are designed to interconnect selected ones of the elements 57 on different layers of the structure and also to couple the outlying pads 24 to upper surface circuitry such as pads 57. The two thru-holes on opposite sides of device 35 provide these latter couplings and it is understood that several other thru-holes are needed to also couple the other pads 24 which form the pattern of several such pads shown in FIG. 3A. Pads 31 are also preferably coupled to surface circuitry using these thru-holes, as seen in FIG. 9A.

The embodiment of FIG. 8 is understood to represent a simplistic view of one embodiment of the invention. It is understood that in a preferred embodiment, several additional substrates will be utilized to provide additional functioning capability for the resulting structure as is demanded in today's rapidly expanding technologies which utilize such circuitized structures. For example, as many as forty individual substrates may be combined and laminated together to form such a multilayered structure. The embodiment in FIG. 8 and others as shown herein are thus represented in such a format for ease of illustration and description.

Figure 9:
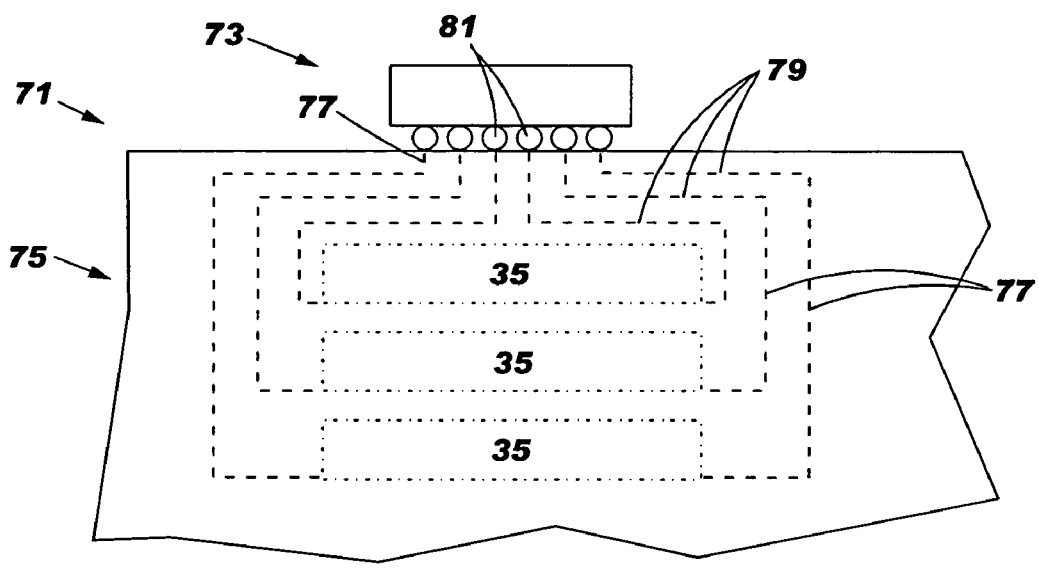
FIG. 9 is a schematic view illustrating the utilization of a plurality of internal organic memory devices within a multilayered substrate and a representative pattern of how each of these may be electrically coupled to an external electronic component such as a logic semiconductor device (chip) to form an electrical assembly in accordance with one embodiment of the invention.

FIG. 9 represents an electrical assembly 71 according to one embodiment of the invention. This assembly is shown to include a plurality of internal organic memory devices 35 arranged in a substantially vertical, stacked orientation and formed in the manner described above. Assembly 17 thus includes a plurality of bonded substrates to result in a multilayered construction in which the substrates described above form only one aspect thereof. In the embodiment of FIG. 9, each of the organic memory devices is shown schematically as being electrically coupled upwardly to an electronic component 73 which in turn is positioned on a top surface of the underlying multilayered substrate 75 including the invention. These forms of connection between the internal memory device and external component 73 are preferably accomplished using a specified pattern of thru-holes 77 as described in FIG. 8 in combination with linear signal layers 79 which terminate on the upper surface of the substrate 75 in a plurality of pads such as those described hereinabove. Such pads in turn may be electrically coupled to component 73 using solder balls 81 of conventional material. Understandably, thru-holes 71 pass thru the plurality of dielectric layers (including the second dielectric layer located immediately over the outer pads 24 and 31) located over the device and which form part of the described substrates which are bonded to the formed circuitized substrate shown in FIG. 6. Examples of an electrical component 73 include a logic semiconductor device (chip) as shown, and a chip carrier. If electrically connected to a chip alone, the electrical assembly 71 may be referred to as a chip carrier or the like. If the component is itself a chip carrier, assembly 71 may be in the form of a PCB. As a PCB, it may also include individual chips mounted thereon without being contained within "carrier" housings, as well other discrete components such as capacitors and resistors, mounted thereon. Thus, the internal memory devices formed within the multilayered circuitized substrate shown in FIG. 9 may work in conjunction with a combination of many corresponding logic chips to provide a finished electrical assembly with enhanced capabilities without the need for additional semiconductor chips (e.g., memory chips) also located on the assembly's external surface(s), thus saving significant board real estate for such a product while in turn enhancing miniaturization thereof. These represent significantly advantageous features of the present invention and are obviously highly desired in the electronic packaging art.

Figure 9A:
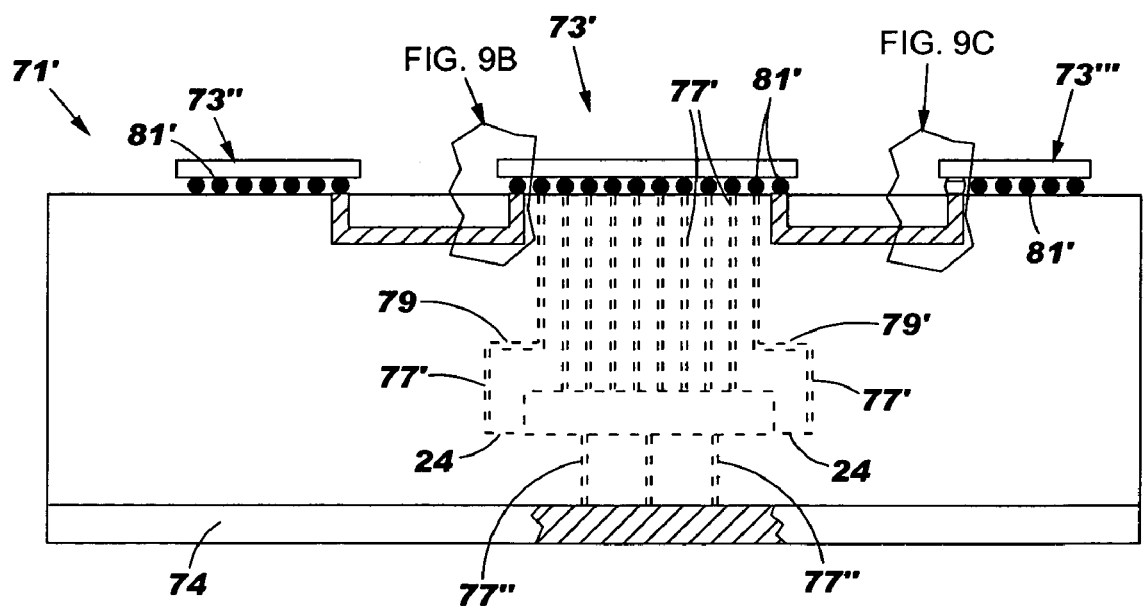
FIG. 9A is also a schematic view, illustrating a circuitized substrate which includes an internal memory device connected to a first electrical component (i.e., a logic semiconductor chip), which in turn is coupled electrically to one or more electrical components also positioned on the substrate.

FIG. 9A is also a schematic view, partly in section, showing another expanded version of an electrical assembly of the invention. For ease of illustration, only a single memory device 35 is shown internally of the multilayered substrate structure 71'. Device 35 is coupled to the component 73' (e.g., a logic chip) using a plurality of the above-described thru-holes 77' (several shown projecting upwardly from behind device 35 as these are understood to be coupled to pads 24 and 31 located behind the device). Preferably, thru-holes 77' extend upwardly to solder ball connections 81' such that each solder ball is "centered" on the thru-hole's upper opening and in contact with the conductive coating/layer which is formed on the sides of the thru-holes and extends to a "land" or like pad structure (not shown) on the assembly's top surface. Such "lands" or the like which form part of or are coupled to a thru-hole are known in the art and, an extended version being shown and described in greater detail below with respect to FIG. 9B. FIG. 9A also illustrates the addition of two more electrical components 73" and 73'" (again, preferably logic chips or chip carriers) positioned on the upper surface of the assembly on opposite sides of interim component 73'. Component 73' is shown, schematically, as being coupled to each adjacent component using, for example, one of the possible connection structures shown in FIGS. 9B and 9C, described in greater detail below. Solder balls 81' are preferably used to connect components 73" and 73'" to respective pads (see FIG. 9B) on the upper surface. As such, components 73" and 73'" are also preferably coupled to other internal circuit layers and structures (e.g., internal "vias") within the multilayered substrate. In some instances, other suitable connection means may be utilized, such as the optical connection illustrated in FIG. 9C and defined in greater detail below. Such alternative connection means may be used in combination with the solder ball connections, as shown in FIG. 9A, or as a complete substitute therefore.

FIG. 9A also illustrates the use of a heat-sinking member 74 which, in a preferred embodiment, is a solid metal (e.g., copper) plate which is bonded (e.g., using adhesive) to the underside of the circuitized substrate of the assembly 71'. Member 74 is preferably thermally coupled to the underside of device 35 using a plurality of thru-holes 77" similar to those thru-holes 77' which electrically couple device 35 to component 73'. This heat passage will occur through the conductive layers which form part of each thru-hole and may also be transferred using thermally conductive paste or other medium located within the confines of each PTH. A suitable paste may be one of those defined above, as electrical conductivity will not adversely affect the invention at this location as it is understood there are no conductors on the undersurface of device 35. It is within the scope of the invention, however, to provide one or more electrical conductors (e.g., similar to external pads 24 and 31 but directly on the device's undersurface) which form part of the device's circuitry and which may be coupled to member 74 for electrical purposes also (e.g., for electrical grounding).

Figure 9B:
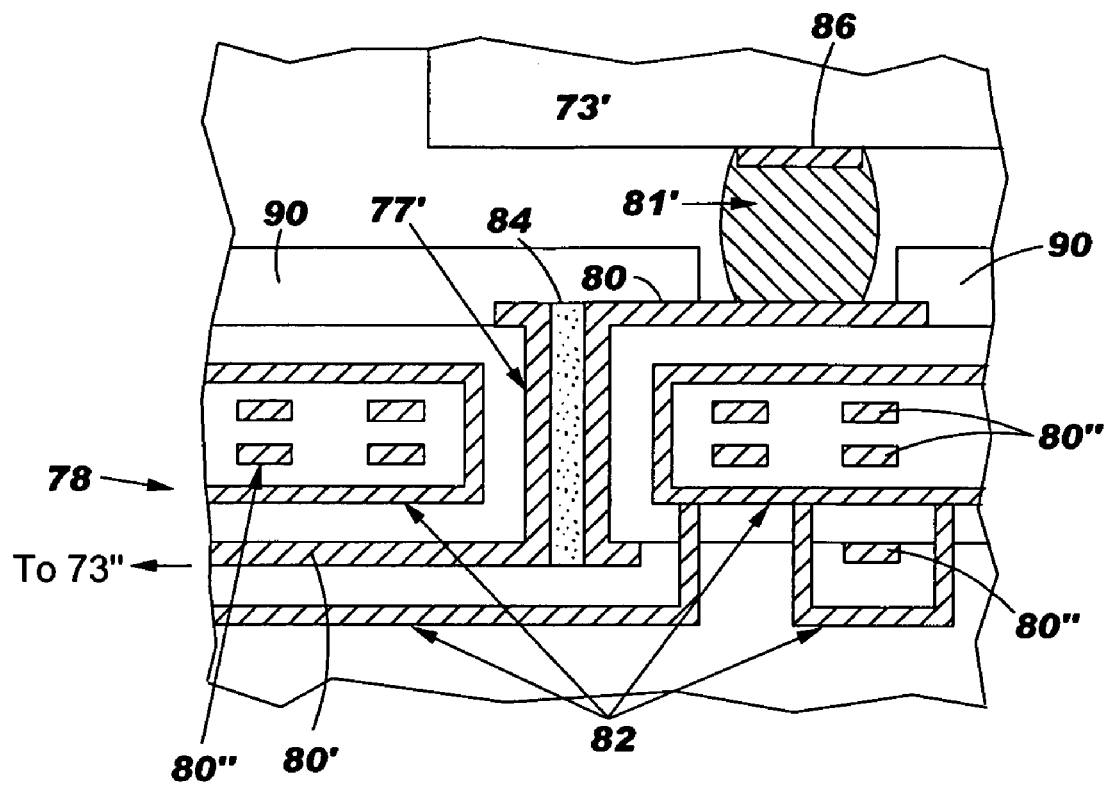
FIG. 9B is an enlarged, partial view taken from part of FIG. 9A, showing one example of a connection structure for electrically coupling first and second electrical components such that radio frequency signals may pass therebetween.

In FIG. 9B, there is shown a much enlarged, albeit partial, view of one example of a form of electrical connection between components 73' and 73". In the simplest form, such a connection structure may simply comprise a plurality of conventional signal lines (or traces) at various levels within the underlying substrate coupled upwardly to the respective solder balls of each component using conventional thru-holes. This is also true for the connection structure for coupling components 73' and 73'". However, the connection structures shown in FIGS. 9A and 9B are provided to illustrate additional and/or alternative forms of connection between the components shown herein to thus further expand the capabilities of the invention. It is also within the scope of the invention to use one or both of these alternative connecting structures in combination with the above conventional structures as well as in combination with each other. It is thus possible to couple component 73' to one or both of the other components using all three such connection structures described herein, adding significant flexibility of design as one of the invention's outstanding features.

FIG. 9B represents a connecting structure 78 particularly designed for enabling enhanced passage of radio frequency (RF) signals between electrical components 73' and 73". Such passage is considered essential to couple many of today's logic chips and similar components which require passage of such higher frequency signals. Such passage results in the aforedefined reduction in signal "noise" as well as low losses in signal transmission. In its simplest form, connecting structure 78 includes at least one signal conductor 80 in the form of an extended PTH "land" as defined above or simply a conductive line or trace coupled to the land of a PTH 77' similar to those defined above. PTH 77' is in turn coupled downwardly to another signal line or trace 80' which extends across the substrate to a similar thru-hole and conductor structure for the adjacent component 73" (not shown in FIG. 9B for reasons of simplicity, albeit the circuitry under the corresponding solder ball 81' for component 73" is preferably a mirror image of that shown in FIG. 9B). Several additional signal lines (i.e., 80''') may also be used to couple these components at various levels within the substrate, each signal line in turn possibly being electrically coupled to a respective solder ball connection or possibly combined with other signal lines to couple to one solder ball connection on each of the components. All of this depends of course on the operational requirements for the invention and again represents the flexibility of design that the invention possesses. RF signal passage through these various signal lines is enhanced by the utilization of shielding ground planes or similar structures 82 which substantially "surround" each signal conductor, either singularly or when the conductors are paired in adjacent and parallel orientation, as well as in other multiple combinations, as represented in FIG. 9B. The substrate of the invention is thus able to use its own internal circuitry for providing such enhanced connections between components mounted on the upper surface thereof. Again, such RF coupling may form only part of the electrical connection between adjacent components. For example, such ground conductor "shielding" may be for only selected ones of the signal conductors such that conventional circuit lines and thru-holes may be used. It is noted in FIG. 9B that thru-hole 77' is also shielded by the surrounding vertical ground conductors 82 (shown in cross section on opposite sides thereof but understood to surround the thru-hole). It is also noted that the formed ground shielding structure may be formed using conventional PCB processing, including when forming the signal lines depicted herein, representing a cost savings for the final product. Further, it is added that whether a non-shielded thru-hole or that shown in FIG. 9B is used, such a thru-hole may also include electrically conductive paste of the type defined above therein for enhanced conductivity. Such paste is shown only partly in FIG. 9B and represented by the numeral 84.

FIG. 9B also shows the use of solder ball 81' to couple the upper end of thru-hole 77' (or an extending line from the land thereof) to component 73'. If the component is a chip or chip carrier, solder ball 81' is preferably connected to a conductor 86 of conventional construction which is located on the underside of the component. A preferred example of such a conductor is a copper pad or, in the case of a chip, a pad of copper or aluminum. Chips typically include several hundred such contact "sites", and chip carriers, such as those produced by the assignee of the present invention, include a similar, relatively large number of contact "pads". Final coupling of the solder ball to this pad and to the underlying signal carrier is preferably achieved using a conventional solder reflow operation, the ball possibly being initially positioned on either the component or substrate using a paste as is also known. Further description is not deemed necessary.

Although FIG. 9B shows the thru-hole 77' slightly offset from directly below solder ball 81', the thru-hole may terminate directly below pad 86 such that ball 81' rests substantially centrally on the top portion of the thru-hole's conductive material (preferably copper). Such a thru-hole may also include the defined conductive paste therein and/or a conductive "cap" member, e.g., a solid copper pad, positioned there-over. It is also within the scope of the invention to utilize a non-conductive paste instead of a conductive one within thru-holes such as those described herein because the plated sidewalls of such thru-holes will provide an appropriate electrical path sufficient to make the necessary connections. The solder ball 81', if such a cap is used, is directly coupled to the pad rather than on an open end portion, including one containing paste. The offset orientation in FIG. 9B is not meant to limit the invention, therefore. In addition, it is also preferred to use what is referred to in the industry as a solder mask layer 90 which is positioned on the top surface of the invention's substrate and surrounds each of the several solder balls 81' used to couple the components thereto. Such material is used in the industry as a deposition layer of dielectric material located atop circuitry for providing masked openings in the layer which expose conductors there-under to facilitate solder ball positioning, following which reflow occurs.

Figure 9C:
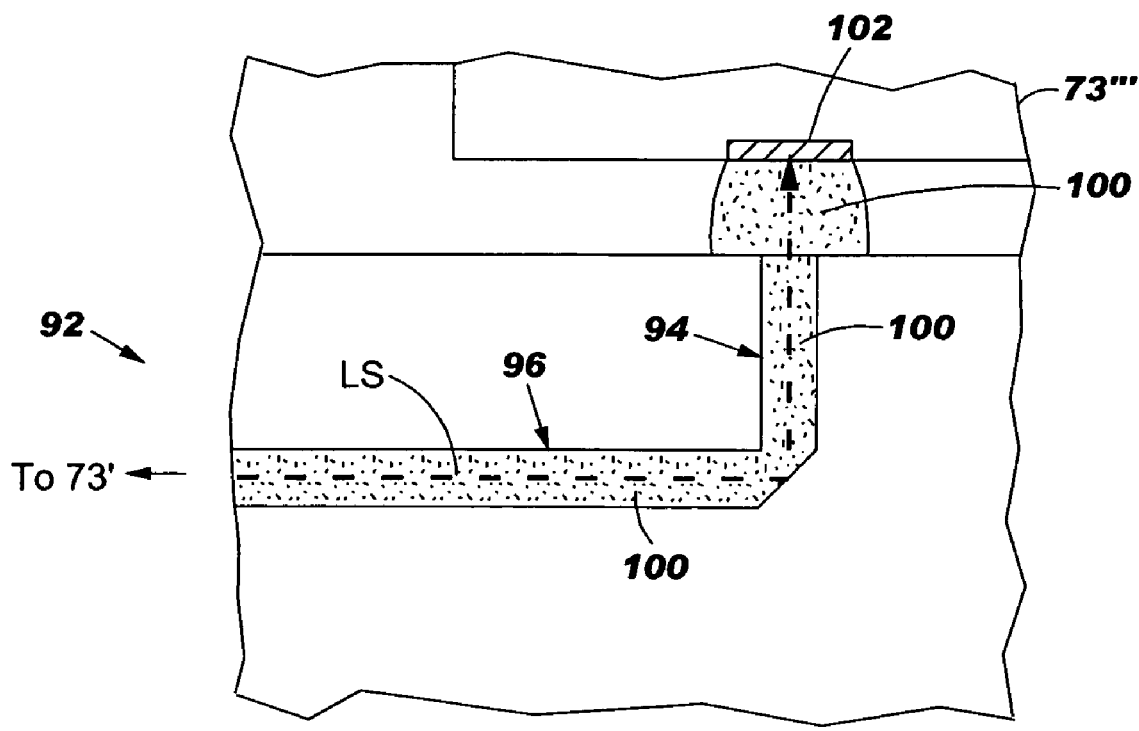
FIG. 9C is also an enlarged, partial view taken from part of FIG. 9A, showing one example of an optoelectronic connection between two electrical components on the substrate of the invention.

FIG. 9C represents a third approach to connecting one of the components of the invention to another. Here, an optoelectronic connection structure 92 is formed within the circuitized substrate for optically coupling electrical component 73' (not shown) to electrical component 73'''. Structure 92 is in the form of a pair of vertical openings 94 (one shown below component 73''' and a similar one (not shown) extending downwardly from component 73') and at least one longitudinal horizontal opening 96. As in FIG. 9B, the part of connecting structure not shown in FIG. 9C is preferably a mirror image of that part shown in FIG. 9C. Openings 94 and 96, which function as conduits for transmitted light signals in the same manner as conventional optical fiber, are physically connected and include therein a transparent polymer material 100 to provide an optical waveguide through which optical signals may pass from one component to another. One of these light signals is represented by the arrow "LS". Each component will in turn include a conventional optoelectronic transmitter/receiver member 102 for transmitting, receiving and converting optical signals to electrical ones. Thus, both components are coupled electrically using the interim optoelectronic structure shown herein. Each of the openings (conduits) 94 and 96 are understood to be formed within the dielectric material of the invention, including that in one or more layers including the defined conductive circuitry which is formed thereon. Understandably, these openings do not damage or extend through the metallic circuitry and are isolated therefrom by a suitable thickness of the dielectric. The polymer material 100 immediately below transmitter/receiver 102 may be in the form of a solid bulbous member, as shown, or the space between the transmitter/receiver and the upper surface of the underlying substrate may be left vacant. Optical signals will still project across such an open space and impinge on the respective transmitter/receiver or be produced by this component to impinge on the open end portion of the polymer material in opening 94. In an alternative embodiment, the polymer material 100 may be replaced by conventional optical fiber.

Figure 10:
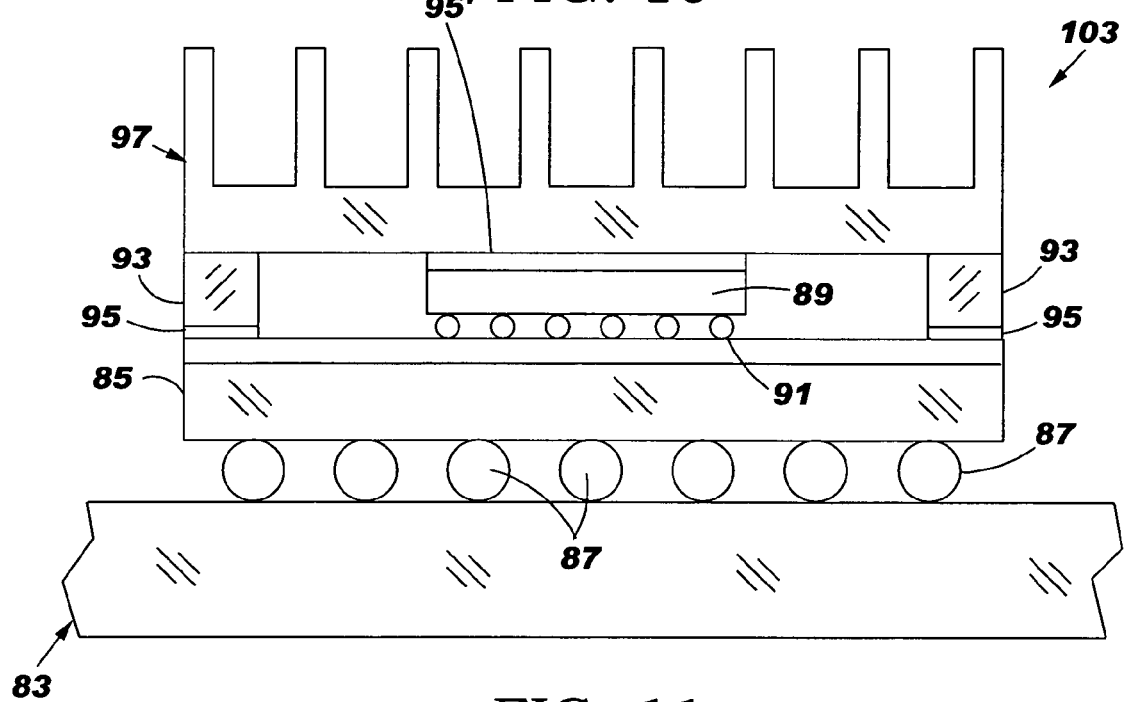
FIG. 10 is an elevational view of two electrical assemblies capable of utilizing the teachings of the instant invention, these being a chip carrier including at least one external chip as part thereof, and a PCB having such a chip carrier positioned thereon.

FIG. 10 represents two examples of electrical assemblies including various components which utilize the circuitized substrates of the instant invention, including those multilayered substrate structures having additional substrates as part thereof. For example, the structure referred to by the numeral 83 may be a multilayered PCB and include conventional internal multilayers of circuits and dielectric layers as known in the art. Atop this PCB and electrically coupled thereto is a second, smaller assembly 85, preferably a chip carrier as described above, which in turn is electrically coupled to the underlying, larger PCB 83 using a plurality of solder balls 87 of conventional metallurgy (typically a lead and tin composition) similar to those for solder balls 81 and 81'. Positioned on and electrically coupled to the carrier substrate 85 is a semiconductor chip, such as a logic chip 89, which in turn is electrically coupled to the underling substrate 85, also preferably using solder balls 91 of conventional composition. Standoffs 93 secured to the substrate 85 using an adhesive 95 are also used to position a heat sink 97 atop the hotter operating logic semiconductor chip 89 and thermally coupled to the chip, also using an adhesive 95'. Such heat sinks, adhesives and standoffs, if utilized, are known in the art and further description is not believed needed. With respect to the instant invention, the multilayered substrate 85 may be similar to that shown in FIG. 8 (more preferably in FIG. 9) with the corresponding chip 89 being a hotter, logic chip which may require additional heat-sinking as provided by the thermally bonded heat sink 97. It is also within the scope of the invention to include one or more internal organic memory devices (not shown) within the larger, underlying PCB 83, and couple these to substrate 85 through solder connections 91, thereby adding still more memory capabilities for the overall package 103 which includes both substrates 83 and 85.

Figure 11:
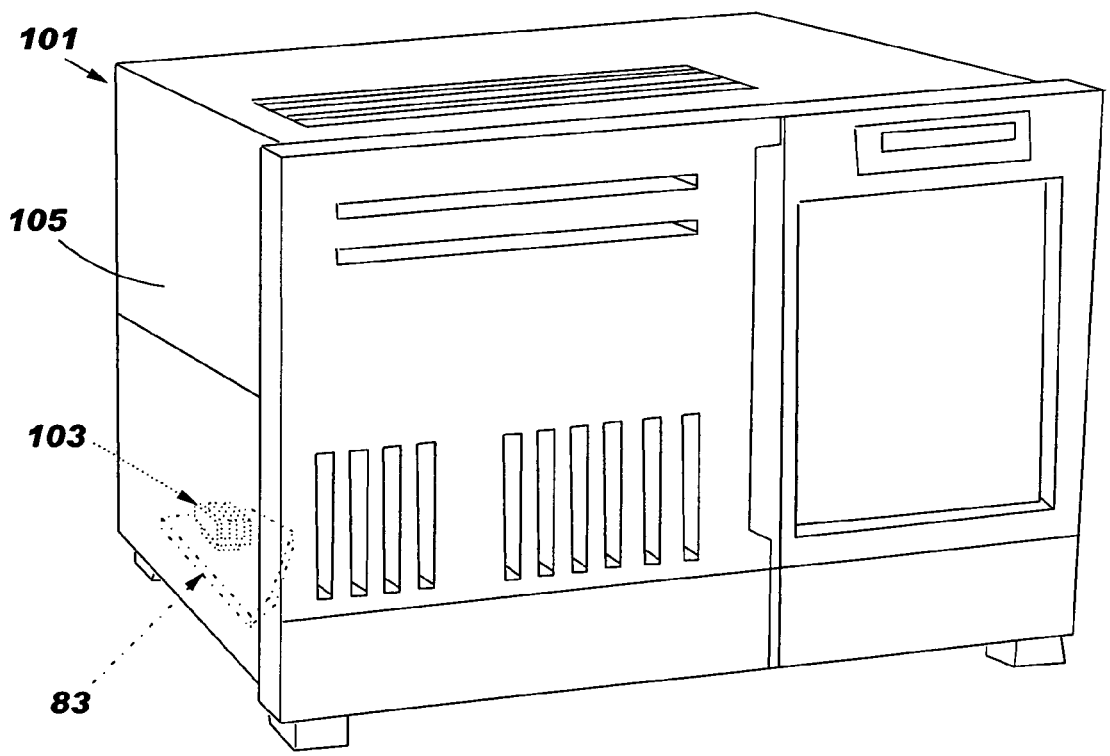
FIG. 11 is a perspective view, on a much reduced scale, of an information handling system according to one embodiment of the invention which is capable of utilizing one or more of the electrical assemblies of the invention.

In FIG. 11, there is shown an information handling system 101 in accordance with one embodiment of the invention. System 101 may comprise a personal computer, In FIG. 11, there is shown an information handling system 101 in accordance with one embodiment of the invention. System 101 may comprise a personal computer, mainframe computer, computer server, or the like, several types of which are well known in the art. System 101, as taught herein, may include the electrical assemblies as shown in FIG. 10, including both PCB 83 and carrier 85, and is represented by the numeral 103 in both FIGS. 10 and 11. This assembly, shown hidden, may be mounted on still a larger PCB or other substrate, one example being a "motherboard" of much larger size, should such a board be required. These components are shown hidden because these are encased within and thus behind a suitable housing 105 designed to accommodate the various electrical and other components which form part of system 101. PCB 83 may instead comprise such a "motherboard" in system 101 and thus include additional electrical assemblies, including additional printed circuit "cards" mounted thereon, such additional "cards" in turn also possibly including additional electronic components as part thereof. It is thus seen and understood that the electrical assemblies made in accordance with the unique teachings herein may be utilized in several various structures as part of a much larger system, such as information handling system 101. Further description is not believed necessary.

Thus there has been shown and described an electrical assembly which provides, uniquely, for an internal organic memory device as part of the assembly's circuitized substrate which functions similarly to semiconductor chips of silicon and other materials which are conventionally positioned externally of circuit boards and the like and must be formed using complex chip technology. The internal memory devices taught herein are formed using conventional PCB technology with relatively minor modification thereto and thus result in an end product possessing significant capabilities but which is attainable at relatively inexpensive cost compared to that of independent chip formation and subsequent attachment and coupling to the corresponding substrate to which these are secured. Significantly, the internal memory device taught herein is operable in such an environment as also taught herein without causing damage, e.g., by excessive heat formation, to the adjacent and other layers which constitute the final substrate structure. Should such a device having greater operating temperatures be desired, the invention provides for suitable heat sinking of the memory device through a unique heat sink member which is also positioned on and may form part of the ultimate assembly.

It is believed that this invention, therefore, represents a significant advancement in the art for these reasons and others discernible from the teachings herein.

While there have been shown and described what are at present the preferred embodiments of the invention, it will be obvious to those skilled in the art that various changes and modifications may be made therein without departing from the scope of the invention as defined by the appended claims.

What is claimed is:

1. An electrical assembly comprising:
   a circuitized substrate including a first layer of organic dielectric material and a first electrically conductive circuit formed on said first layer of organic dielectric material, part of said first layer of organic dielectric material and a corresponding part of said first electrically conductive circuit forming a first, base portion of an organic memory device, a thin layer of organic polymer material positioned on said corresponding part of said at least one electrically conductive circuit which forms said first, base portion of said organic memory device, and a second electrically conductive circuit formed on said thin layer of organic polymer material, said second electrically conductive circuit and said corresponding part of said first electrically conductive circuit each comprising a plurality of narrow circuit lines which cross each other at predetermined locations to define points of contact at said locations, said thin layer of organic polymer material and said second electrically conductive circuit forming a second portion of said organic memory device;
   a second layer of organic dielectric material positioned over said organic memory device;
   a first electrical component positioned on said circuitized substrate and electrically coupled to said organic memory device through said second layer of organic dielectric material; and
   a second electrical component positioned on said circuitized substrate and electrically coupled to said first electrical component.

2. The electrical assembly of claim 1 wherein said thin layer of organic polymer material comprises a ferroelectric thin film material.

3. The electrical assembly of claim 2 wherein said ferroelectric thin film material is selected from the group consisting of polyvinylidene and copolymers thereof, nylon and copolymers thereof, cyanopolymers and copolymers thereof, and combinations thereof.

4. The electrical assembly of claim 3 wherein said ferroelectric thin film material is polyvinylidene fluoride-trifluoroethylene, and has a thickness of from about 0.5 to about three microns.

5. The electrical assembly of claim 1 wherein selected ones of said circuit lines of said first and second electrically conductive circuits each have a width of from about five to about fifty microns.

6. The electrical assembly of claim 1 wherein said first layer of organic dielectric material comprises a polymer material.

7. The electrical assembly of claim 1 wherein said first layer of organic dielectric material is selected from the group of polymer materials consisting of fiberglass-reinforced epoxy resins, polytetrafluoroethylene, polyimides, polyamides, cyanate resins, photoimageable materials, and combinations thereof.

8. The electrical assembly of claim 1 wherein said first and second electrically conductive circuits are each comprised of a metal selected from the group consisting of copper, copper alloy, aluminum, aluminum alloy, conductive polymers, and combinations thereof.

9. The electrical assembly of claim 1 wherein each of said first and second electrical components positioned on said circuitized substrate comprises a chip carrier.

10. The electrical assembly of claim 1 wherein each of said first and second electrical components positioned on said circuitized substrate comprises a semiconductor chip.

11. The electrical assembly of claim 1 further including an optoelectronic connecting structure substantially within said circuitized substrate, said optoelectronic connecting structure providing at least part of said electrical coupling between said first and second electrical components.

12. The electrical assembly of claim 11 wherein said optoelectronic connecting structure comprises a plurality of physically connected openings and a quantity of transparent polymer material, said transparent polymer material being positioned within said plurality of physically connected openings.

13. The electrical assembly of claim 1 further including connecting structure for enabling passage of radio frequency signals between said first and second electrical components, said connecting structure for enabling passage of radio frequency signals between said first and second electrical components being positioned substantially within said circuitized substrate and providing at least part of said electrical coupling between said first and second electrical components.

14. The electrical assembly of claim 13 wherein said connecting structure for enabling passage of radio frequency signals between said first and second electrical components comprises at least one signal path and a shielding structure adapted for shielding said signal path during the passage for electrical signals of radio frequency wavelengths therethrough.

15. The electrical assembly of claim 1 further including a heat sinking member positioned on said circuitized substrate for providing heat sinking of said organic memory device.

16. The electrical assembly of claim 1 further including a plurality of thru-holes within said second layer of organic dielectric material positioned over said organic memory device, said plurality of thru-holes electrically coupling said organic memory device to said first electrical component.

17. A method of making an electrical assembly, said method comprising:
providing a circuitized substrate including a first layer of organic dielectric material and a first electrically conductive circuit on said first layer of organic dielectric material, part of said first layer of organic dielectric material and a corresponding part of said first electrically conductive circuit forming a first, base portion of an organic memory device;
forming a thin layer of organic polymer material on said corresponding part of said at least one electrically conductive circuit which forms said first, base portion of said organic memory device;
forming a second electrically conductive circuit on said thin layer of polymer material, said second electrically conductive circuit and said corresponding part of said first electrically conductive circuit each comprising a plurality of narrow circuit lines which cross each other at predetermined locations to define points of contact at said locations, said thin layer of organic polymer material and said second electrically conductive circuit forming a second portion of said organic memory device;
forming a second layer of organic dielectric material over said organic memory device;
positioning a first electrical component on said circuitized substrate and electrically coupling said organic memory device through said second layer of organic dielectric material to said first electrical component; and
positioning a second electrical component on said circuitized substrate and electrically coupling said second electrical component to said first electrical component.

18. The method of claim 17 wherein said forming of said first and second electrically conductive circuits is accomplished using photolithographic processing.

19. The method of claim 17 wherein said forming of said thin layer of polymer material is accomplished on said corresponding part of said at least one electrically conductive circuit is accomplished using a process selected from the group of processes consisting of spin coating, roller coating, draw coating, slot coating, curtain coating, printing, lamination, electrostatic deposition, and combinations thereof.

20. The method of claim 17 wherein said forming of said forming of said second layer of organic dielectric material over said organic memory device is accomplished using a lamination process.

21. The method of claim 17 wherein said positioning of said first and second electrical components on said circuitized substrate is accomplished using solder ball connections.

22. The method of claim 17 further including forming an optoelectronic connection structure within said circuitized substrate for electrically coupling said second electrical component to said first electrical component.

23. The method of claim 17 further including forming within said circuitized substrate connecting structure for enabling passage of radio frequency signals between said first and second electrical components.

24. The method of claim 17 further including positioning a heat sinking member on said circuitized substrate for providing heat sinking of said organic memory device.

25. The method of claim 17 further including providing thru-holes within said second layer of organic dielectric material for electrically connecting said organic memory device to said first electrical component.

26. An information handling system comprising:
a housing;
a circuitized substrate positioned substantially within said housing and including a first layer of organic dielectric material and a first electrically conductive circuit formed on said first layer of organic dielectric material, part of said first layer of organic dielectric material and a corresponding part of said first electrically conductive circuit forming a first, base portion of an organic memory device, a thin layer of organic polymer material positioned on said corresponding part of said at least one electrically conductive circuit which forms said first, base portion of said organic memory device, and a second electrically conductive circuit formed on said thin layer of polymer material, said second electrically conductive circuit and said corresponding part of said first electrically conductive circuit each comprising a plurality of narrow circuit lines which cross each other at predetermined locations to define points of contact at said locations, said thin layer of organic polymer material and said second electrically conductive circuit forming a second portion of said organic memory device;

a second layer of organic dielectric material positioned over said organic memory device;
a first electrical component positioned on said circuitized substrate and electrically coupled to said organic memory device through said second layer of organic dielectric material; and
a second electrical component positioned on said circuitized substrate and electrically coupled to said first electrical component.

27. The invention of claim 26 wherein said information handling system comprises a personal computer.

28. The invention of claim 26 wherein said information handling system comprises a mainframe computer.

29. The invention of claim 26 wherein said information handling system comprises a computer server.

* * * * *